United States Patent
Kang

(10) Patent No.: US 8,253,244 B2
(45) Date of Patent: *Aug. 28, 2012

(54) SEMICONDUCTOR PACKAGE HAVING MEMORY DEVICES STACKED ON LOGIC DEVICE

(75) Inventor: Uk-Song Kang, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/946,141

(22) Filed: Nov. 15, 2010

(65) Prior Publication Data

US 2011/0057310 A1    Mar. 10, 2011

Related U.S. Application Data

(63) Continuation of application No. 12/190,224, filed on Aug. 12, 2008, now Pat. No. 7,834,450.

(30) Foreign Application Priority Data

Aug. 20, 2007    (KR) .................. 10-2007-0083607

(51) Int. Cl.
*H01L 23/34* (2006.01)

(52) U.S. Cl. ........ 257/724; 257/725; 257/737; 257/738; 365/51

(58) Field of Classification Search .......... 257/723–725, 257/737–738, 777–778; 365/51–52, 63
See application file for complete search history.

(56) References Cited

U.S. PATENT DOCUMENTS

| | | | |
|---|---|---|---|
| 3,461,431 A | 8/1969 | Ellinger et al. | |
| 5,682,062 A | 10/1997 | Gaul | |
| 6,683,374 B2 | 1/2004 | Goller et al. | |
| 7,296,124 B1* | 11/2007 | Falik | 711/157 |
| 7,834,450 B2* | 11/2010 | Kang | 257/724 |
| 2005/0170600 A1 | 8/2005 | Fukuzo | |
| 2010/0091537 A1 | 4/2010 | Best et al. | |

FOREIGN PATENT DOCUMENTS

| | | |
|---|---|---|
| JP | 2003060153 A | 2/2003 |
| JP | 2007036104 A | 2/2007 |
| KR | 1020060053168 A | 5/2006 |

* cited by examiner

*Primary Examiner* — Gene Auduong
(74) *Attorney, Agent, or Firm* — Volentine & Whitt, PLLC

(57) ABSTRACT

A semiconductor package includes a base substrate, a logic device with a serializer/deserializer (SerDes), a plurality of odd memory devices disposed on a lower surface of the logic device and operatively stack-connected with the SerDes, and a plurality of even memory devices disposed on an upper surface of the logic device and operatively stack-connected with the SerDes, such that the plurality of odd memory devices and the plurality of even memory devices are connected in parallel by the SerDes.

21 Claims, 3 Drawing Sheets

SEMICONDUCTOR PACKAGE HAVING MEMORY DEVICES STACKED ON LOGIC DEVICE

CROSS-REFERENCE TO RELATED APPLICATIONS

This application is a continuation of U.S. patent application Ser. No. 12/190,224 filed on Aug. 12, 2008, which claims the benefit of Korean Patent Application No. 10-2007-0083607 filed Aug. 20, 2007. The subject matter of both of these applications is hereby incorporated by reference in their entirety.

BACKGROUND OF THE INVENTION

The present invention relates generally to semiconductor devices, and more particularly, to semiconductor packages including at least one memory device stacked on a logic device.

SUMMARY OF THE INVENTION

In one embodiment, the invention provides a stacked semiconductor package incorporating a memory system (i.e., one or more memory devices and an operationally related logic device) characterized by high-speed data input/output (I/O) capabilities.

In one embodiment, the invention provides a semiconductor package, comprising; a base substrate, a logic device disposed on the base substrate, comprising a serializer/deserializer (SerDes) and having an upper surface and an opposing lower surface, a plurality of odd memory devices disposed on the lower surface of the logic device, wherein each one of the odd memory devices is operatively stack-connected with the SerDes, and a plurality of even memory devices disposed on the upper surface of the logic device, wherein each one of the even memory devices is operatively stack-connected with the SerDes, wherein the plurality of odd memory devices and the plurality of even memory devices are connected in parallel by the SerDes.

DESCRIPTION OF EMBODIMENTS

As consumer electronics and other host devices have become smaller and increasingly portable in their operation, the demand for multi-functional semiconductors has increased. This is particularly true of memory systems, including one or more memory devices (e.g., memory devices or packaged (wholly or it art) memory devices) and a corresponding logic or control device (e.g., a memory controller, a controller, or a data switch). By packaging memory systems into a single semiconductor package, competent systems may be obtained with greater reliability, smaller size, and reduced power consumption at lower process. Accordingly, various "stacking" techniques have been proposed to implement memory devices on corresponding logic devices within a single semiconductor package. Stacked semiconductor packages afford several benefits including reduced fabrication costs, shortened signal transmission paths, faster overall operation and reduced power consumption.

By way of background and comparison, Figure (FIG.) 1 schematically illustrates a conventional stacked semiconductor package including a plurality of memory devices.

Figure 1:
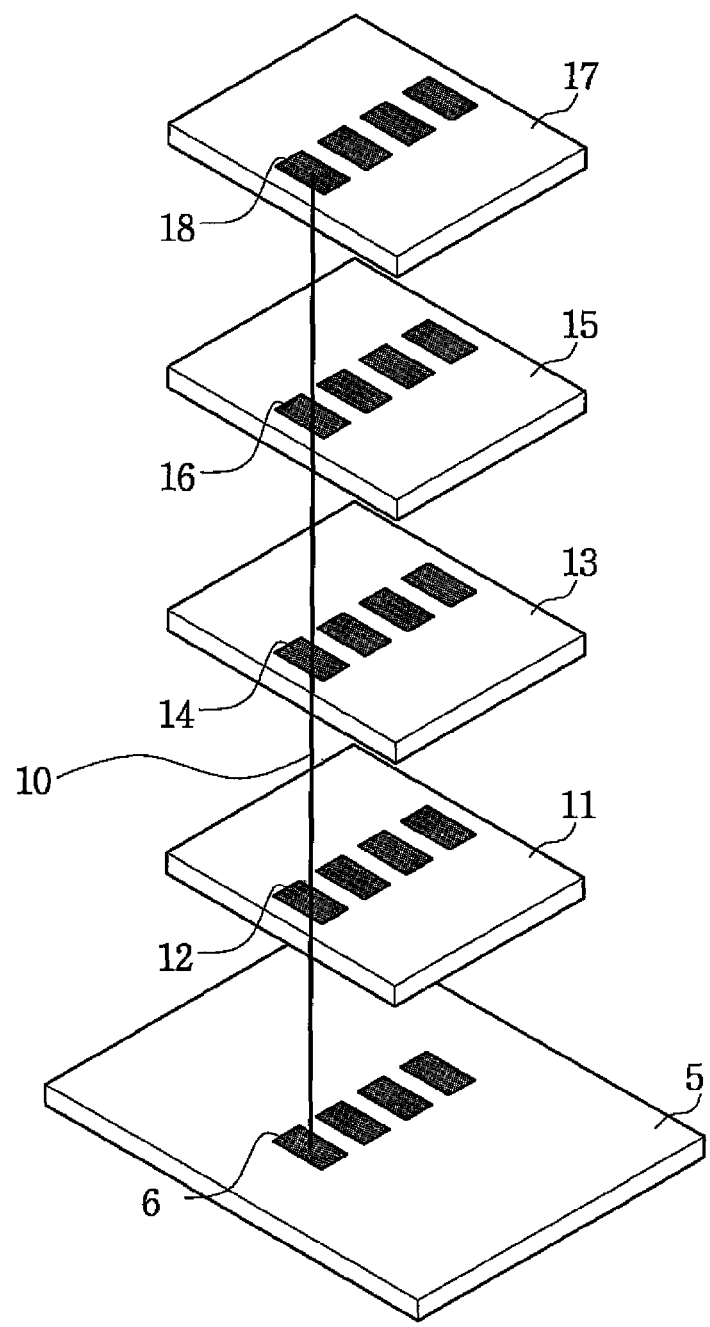
FIG. 1 schematically illustrates a conventional semiconductor package including a plurality of memory devices.

Referring to FIG. 1, the conventional semiconductor package includes first through fourth memory devices 11, 13, 15 and 17 stacked on a logic device 5. The first through fourth memory devices 11, 13, 15 and 17 respectively include a plurality of signal line terminals 12, 14, 16 and 18. Signal line terminals 12, 14, 16 and 18 are electrically connected in parallel between the first through fourth memory devices 11, 13, 15 and 17, as well as with signal line terminal 6 disposed on logic device 5. In this manner, a data bus signal 10 may be implemented to connect signal line terminals 12, 14, 16 and 18 with logic signal line terminal 6 using a plurality if vertical connection elements, such as through-silicon vias (TSVs).

Logic device 5 controls the input of data to and the output of data from the first through fourth memory devices 11, 13, 15 and 17. That is, data stored in the first through fourth memory devices 11, 13, 15 and 17 may be read through data bus signal line 10, and externally provided data may be written to one or more of first through fourth memory devices 11, 13, 15 and 17 through data bus signal line 10. Those skilled in the art will recognize that data bus signal line 10 is merely one exemplary signal line selected from larger data bus structures vertically traversing the stacked memory devices. In addition to parallel data bus structures connecting the plurality of memory devices, one or more serial signal lines may be used to communicate one or more serially applied control signals to one or more the memory devices.

Where a write (or program) operation is intended to write data to a first memory device 11 in the stack of memory devices using data signal line 10, for example, the remaining second through fourth memory devices 13, 15 and 17 should remain in a standby mode. Similarly, where a write operation is directed to a second memory device 13 using data signal line 10, the first, third and fourth memory devices 11, 15 and 17 should remain in standby mode. That is, a serial "activate" or "chip select" signal may be used to selectively activate one or more memory devices in the stacked plurality of memory devices based on the data contents of a particular write operation. Unfortunately, the input or output of data from a particular selected memory device may be slowed by operation the serial chip selection signal.

Additional relevant background information may be reviewed by considering the stacked semiconductor packages described in published U.S. Patent Application No. US2005/0170600, the subject matter of which is hereby incorporated by reference.

Several embodiments of the invention will now be described with reference to the accompanying drawings. This invention may, however, be embodied in different forms and should not be construed as being limited to only the illustrated embodiments. Rather, the illustrated embodiments are presented as teaching examples. In the drawings, the thickness of layers and regions may be exaggerated for clarity. Throughout the written description and drawings, like reference numerals are used to indicate like or similar elements.

FIGS. 2 to 5 are cross-sectional views illustrating various semiconductor packages implementing a memory system including a stacked plurality of memory devices and a corresponding logic device according to embodiments of the invention.

Figure 2:
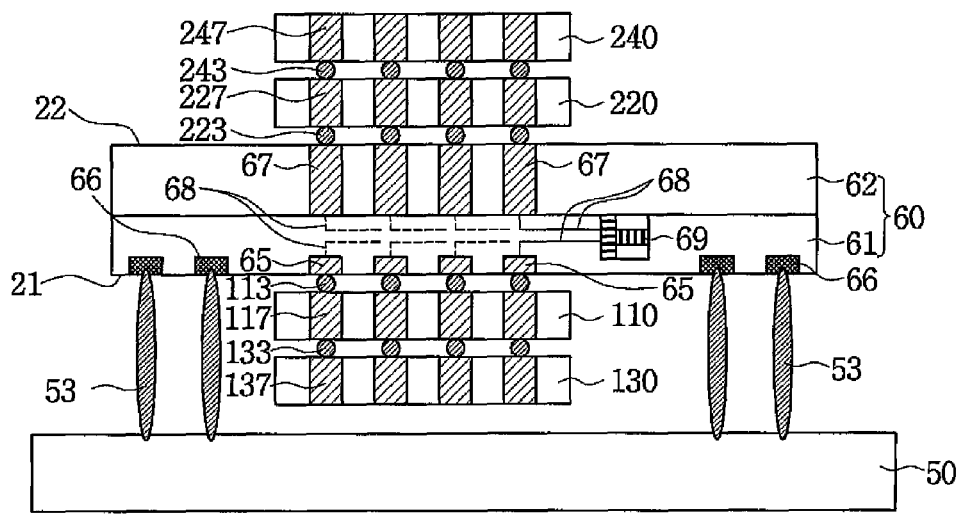
FIGS. 2 to 5 are cross-sectional views illustrating a semiconductor package including memory devices stacked on a corresponding logic device according to various embodiments of the invention.

Referring to FIG. 2, the illustrated semiconductor package comprises a base substrate 50, a logic device 60, a first memory device 110, a second memory device 220, a third memory device 130, and a fourth memory device 240.

Base substrate 50 may be a print circuit board (PCB) or a semiconductor substrate which includes I/O terminals adapted to receive externally provided input signals and communicate output signals containing data information to one or more external circuits. Logic device 60 is disposed on base substrate 50 using one of a number of conventionally understood mounting techniques. Logic device 60 generally includes an "upper" surface 22 and an opposing "lower" surface 21. Such terms as "upper" and "lower", as well as "vertical" and "horizontal" are relative terms used to distinguish various features of the illustrated embodiments. For clarity, these terms are use in relation to illustrated embodiments. Those of ordinary skill in the art will understand that such terms are used in a relative context.

First memory device 110 and the third memory device 130 may be sequentially stacked on the lower surface 21 of logic device 60. Thus, memory devices may be stacked in positive (+Z) and negative (−Z) vertical directions relative to the horizontal (X/Y) plane of the primary upper and lower surfaces 21 and 22 of logic device 60. Thus, first memory device 110 and third memory device 130 are said to be negatively stacked on the lower surface 21 of logic device 60. In contrast, second memory device 220 and fourth memory device 240 are sequentially and positively stacked on the upper surface 22 of logic device 60. In this manner "odd memory devices", (e.g., first memory device 110 and third memory device 130) are disposed between base substrate 50 and logic device 60 within the stacked semiconductor package, while "even memory devices" are disposed above base substrate 50.

In the illustrated embodiments, logic device 60 is divided into a circuit region 61 and a substrate region 62. Circuit region 61 is disposed below substrate region 62 and forms lower surface 21 of logic device 60. An additional circuit region may be similarly formed on upper surface 22 in other embodiments of the invention.

Logic device 60 comprises a plurality of first signal terminals 65 disposed on lower surface 21, a plurality of vertical connection elements 67 extending at least partially through the body of the substrate implementing logic device 60 (including substrate region 62), a plurality of I/O terminals 66 disposed on lower surface 21, a serializer/deserializer (SerDes) 69 incorporated within logic device 60 (i.e., disposed on upper surface 22, lower surface 21 and/or contained within the body of the substrate incorporating logic device 60), and a plurality of interconnections 68 between, for example, first signal terminal 65 and SerDes 69 and/or vertical connection elements 67.

First signal terminals 65, I/O terminals 66, the SerDes 69, and the interconnections 68 may be disposed in the circuit region 61. Vertical connection elements 67 may be implemented using through-silicon vias (TSVs), for example, that extend through substrate region 62.

First signal terminals 65 and vertical connection elements 67 may be implemented as separate conductive element sets, or may be integrally implemented. One or more first signal terminals 65 and one or more vertical connection elements 67 may be electrically connected to SerDes 69 through selected ones of the plurality of interconnections 68. I/O terminals 66 may be similarly connected to SerDes 69 using additional interconnection (not shown). First signal terminals 65 and I/O terminals 66 may be selectively exposed on lower surface 21.

Respective I/O terminals 66 may be electrically connected to corresponding signal sources disposed on base substrate 50 via by a terminal interconnections 53. Terminal interconnections 53 may be various implemented using, for example, conductive balls, bumps, wiring, and/or spacers. For example, a ball structure may include a solder ball, a gold ball, a silver ball or combinations thereof. A bump structure may include a solder bump, a gold bump, a silver bump, a Ni bump, or combinations thereof. Wiring may include gold wire, silver wire, aluminum wire, or combinations thereof. A spacer may include a copper spacer, an aluminum spacer, a TiN spacer, a TaN spacer, a gold spacer, a silver spacer, a Pt spacer, a Ni spacer, a W spacer, or combinations thereof.

In the illustrated embodiment, first memory device 110 includes a plurality of first memory signal terminals 117, second memory device 220 includes a plurality of second memory signal terminals 227, third memory device 130 includes a plurality of third memory signal terminals 137, and fourth memory device 240 includes a plurality of fourth memory signal terminals 247. Those skilled in the art will recognize that first through fourth memory devices 110, 220, 130 and 240 will include, as is conventional, a plurality of memory cells connected to corresponding bit lines and word lines. These elements are omitted from the illustrated embodiment for clarity. However, it is understood that the respective memory cells in each memory device are operatively connected to a corresponding one of the first through fourth memory signal terminals 117, 227, 137 and 247.

Each of the first through fourth memory signal terminals 117, 227, 137 and 247 may be implemented using a TSV structure or similar through connection element. First through fourth memory signal terminals 117, 227, 137 and 247 may be formed of one selected from the group consisting of Cu, Ti, Ta, TiN, TaN, Ni, W and combinations thereof. In one embodiment of the invention, first through fourth memory signal terminals 117, 227, 137 and 247 are formed from a Ti/TiN layer.

In the illustrated embodiment, a first conductive bump 113 is disposed between each first memory signal terminal 117 and corresponding first signal terminals 65. A second conductive bump 223 is disposed between each second memory signal terminal 227 and a corresponding, exposed upper portion of a vertical connection element 67. A third conductive bump 133 is disposed between each third memory signal terminal 137 and a corresponding, exposed lower portion of a first memory signal terminal 117. A fourth conductive bump 243 is disposed between each fourth memory signal terminal 247 and a corresponding exposed upper portion of a second memory signal terminal 227. First through fourth conductive bumps 113, 223, 133 and 243 may be implemented using a solder bump, a gold bump, a silver bump, a Ni bump, or combinations thereof.

In other embodiments of the invention, first through fourth conductive bumps 113, 223, 133 and 243 may be replaced with a conductive ball, a conductive wire, or a conductive spacer.

Using the foregoing arrangement of connection elements, the memory devices in the odd and even memory devices stacks are respectively disposed on opposing surfaces of logic device 60 and operatively "stack-connected" with SerDes 69. In this context, the term stack-connected denotes the electrically connection of two or more vertically stacked memory devices to a logic device (e.g., a SerDes) via one or more vertical connection paths traversing at least one substrate implementing one of the memory devices. Stated in other terms an upper memory device in a positively stacked plurality of memory devices is stack-connected through at least one lower memory device in the stack, and a lower memory device in a negatively stacked plurality of memory devices is stack-connected through at least one upper memory device in the stack.

An exemplary operation of the semiconductor package illustrated in FIG. 2 will now be described.

Referring again to FIG. 2, SerDes 69 functions, as is conventionally understood, to receive a parallel signal and to output a corresponding serial and/or parallel signal. SerDes 69 also function to receive a serial signal and to output a corresponding parallel and/or serial signal.

As described above, SerDes 69 is electrically connected to memory cells provided in first memory cell 110 through interconnections 68, selected first signal terminal 65, corresponding first conductive bumps 113, and first memory signal terminal 117. In similar manner, SerDes 69 is electrically connected to memory cells provided in second memory device 220 through interconnections 68, selected vertical connection elements 67, second conductive bumps 223, and second memory signal terminals 227. Thus, respective pluralities of memory cells provided in first memory device 110 and second memory device 220 may be operatively connected with SerDes 69 via parallel bus structures implemented by the foregoing elements.

As a result, SerDes 69 may simultaneously read data stored in first and second memory devices 110 and 220, and output the read data via I/O terminals 66 and terminal interconnections 53 to circuitry associated with base substrate 50. Similarly, SerDes 69 is able to receive write data from I/O terminals 66 and distribute the write data for storage to memory cells provided in first memory device 110 and/or second memory device 220. The parallel connection of first memory device 110 and second memory device 220 with SerDes 69 allows relatively fast data I/O, as compared with conventional architectures connecting first memory device 110 and second memory device 220 with SerDes 69 in series.

Furthermore, SerDes 69 is electrically "through-connected" to additional odd and even memory devices in a similar manner. That is, memory cells provided in third memory device 130 may be accessed during read/write/erase operations through interconnections 68, selected first signal terminals 65, corresponding first conductive bumps 113, first memory signal terminals 117, third conductive bumps 133, and third memory signal terminal 137. In effect, first memory signal terminals 117 function as vertical through connections to third memory signal terminals 137. In a similar manner, SerDes 69 is electrically connected to the memory cells provided in fourth memory device 240 through interconnections 68, selected second signal terminals 67, corresponding second conductive bumps 223, second memory signal terminals 227, fourth conductive bumps 243, and fourth memory signal terminal 247.

By "stack connecting" (e.g., serially connecting using vertically aligned connection elements) a plurality odd memory devices below logic device 60 and a plurality of even memory devices above logic device 60, and then functionally connection these odd and even pluralities of stacked memory devise in parallel with SerDes 69, relatively fast I/O operations may be obtained for a memory system having large data storage capacity. This is particularly true in comparison with conventional examples in which first through fourth memory devices 110, 220, 130 and 240 are connected to SerDes 69 in a single serial path.

Figure 3:
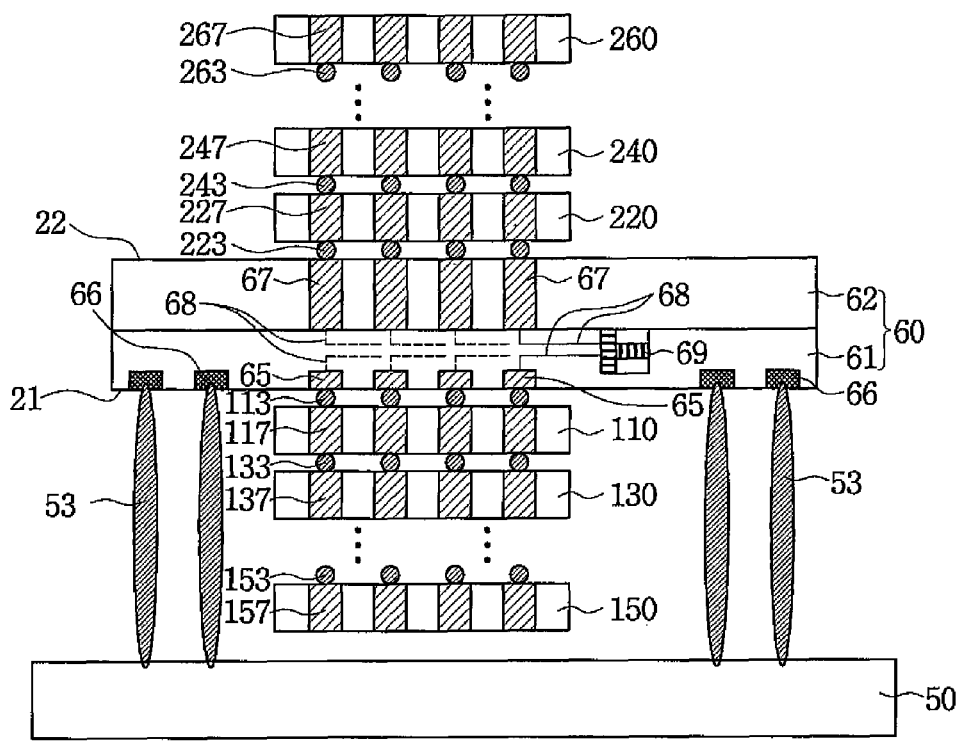

Referring to FIG. 3, a semiconductor package according to another embodiment of the invention is illustrated. Only differences between this embodiment and the embodiment described in relation to FIG. 1 will be described below.

The embodiment of FIG. 3 more generically illustrates that possibility that any reasonable number of memory devices may be stacked connected in the odd (negative vertical) and even (positive vertical) stacks associated with logic device 60. More specifically, an Nth odd memory device 150 is through connected by intervening odd memory devices (i.e., $1^{st}$ through N−1th) with SerDes 69 in the manner described above. Similarly, an Nth even memory device 260 is through connected by intervening even memory devices (i.e., $1^{st}$ through N−1th) with SerDes 69.

So long as effective terminal interconnection elements 53 can be implemented to provide negative vertical stacking room for odd memory devices, and so long as acceptable signal path delays through associated odd and even memory device stacks can be maintained, any reasonable number of odd and even memory devices may be stacked connected above and below logic device 60. In the foregoing embodiments, the odd and even memory devices stacks are shown with equal numbers of memory devices. However, this need not be the case, and in certain embodiments of the invention, the even (positively stacked) memory device stack may include more memory devices than the odd (negatively stacked) memory device stack.

Thus, in the illustrated embodiment of FIG. 3 a fifth memory device 150 includes a plurality of fifth memory signal terminals 157, and a sixth memory device 260 includes a plurality of sixth memory signal terminals 267. Memory cells provided by fifth memory device 150 and sixth memory device 260 may be electrically through connected by respective combinations of elements 113, 117, 133, 137, 153, and 157 or 223, 227, 243, 247, 263, and 267.

Figure 4:
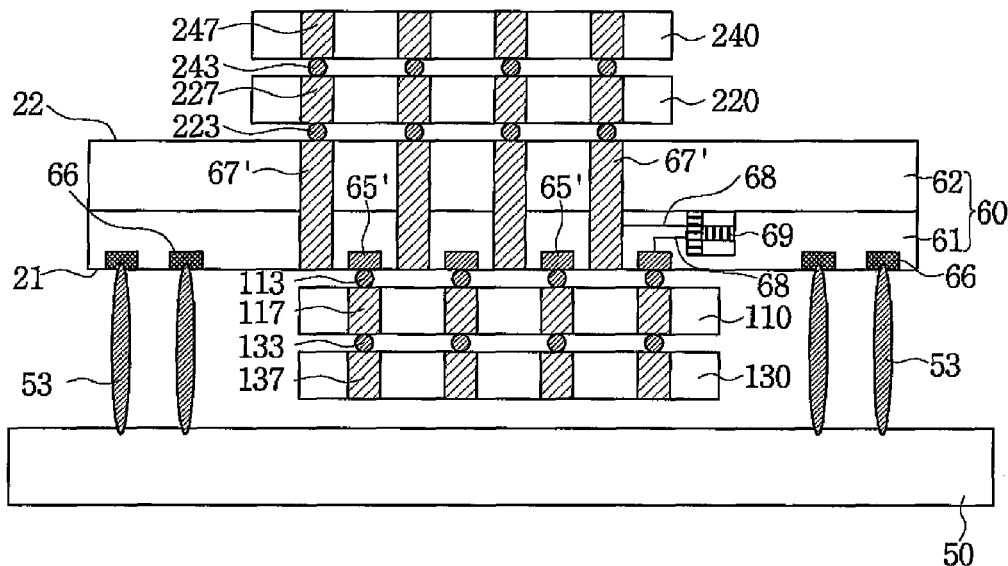

Referring to FIG. 4, a semiconductor package according to another embodiment of the invention is illustrated. Only differences between this embodiment and the embodiment described in relation to FIG. 1 will be described below.

In the embodiment of the invention described in relation to FIG. 1, first signal terminals 65 and corresponding vertical connection elements 67 were respectively aligned in the vertical direction allowing for the possibility of integral fabrication. In contrast, first signal terminals 65' and corresponding vertical connection elements 67' shown in the embodiment of FIG. 4 are non-vertically aligned. In this embodiment, both first signal terminal 65' and exposed lower portions of vertical connection elements 67' are independently accessible on lower surface 21. Of course, lateral running interconnections on lower surface 21 (not shown) or selected interconnections 68 may be used to connect first signal terminals 65' and corresponding vertical connection elements 67'. In FIG. 4, the odd memory device stack is stacked connected to SerDes 69 through first signal terminals 65'.

Figure 5:
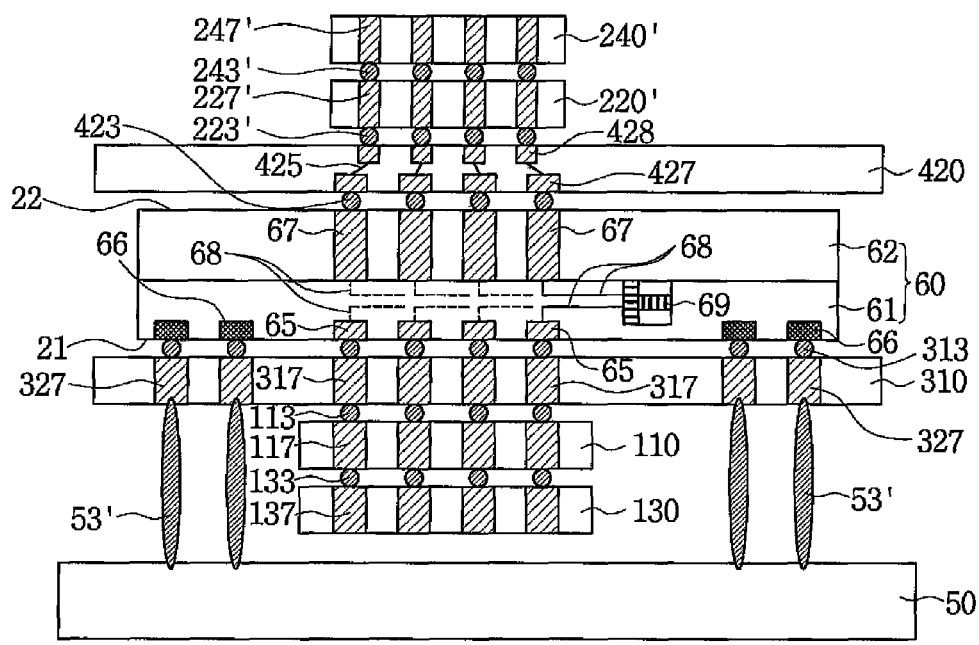

Referring to FIG. 5, a semiconductor package according to yet another embodiment of the invention is illustrated. This embodiment generally comprises base substrate 50, logic device 60, first memory device 110, second memory device 220, third memory device 130, fourth memory device 240, a first interposer 310, and a second interposer 420. Here again, only differences between this embodiment and the embodiment described in relation to FIG. 1 will be described below.

First interposer 310 is disposed between logic device 60 and the odd memory device stack including first memory device 110. That is, first interposer 310 is stacked connected to lower surface 21 of logic device 60. Second interposer 420 is disposed between logic device 60 and the even memory device stack including second memory device 220. That is, second interposer 420 is stacked connected to upper surface 22 of logic device 60.

First interposer 310 and second interposer 420 essentially function as respective redistribution layers. In the illustrated embodiment, first interposer 310 includes a plurality of first redistribution terminals 317 and a plurality of redistribution vertical connection elements 327. Consistent with the foregoing, one or both of the plurality of first redistribution terminals 317 and the plurality of redistribution vertical connection elements 327 may be implemented using TSVs or similar elements. In certain embodiments of the invention, each first redistribution terminal 317 may be fabricated with a geometry and physically disposed at intervals that correspond to respective first signal terminals 65. In contrast, redistribution vertical connection elements 327 are fabricated with a geometry and physically disposed at intervals that correspond to respective I/O terminals 66. First interposer 310 also includes first redistribution bumps 313 disposed between first redistribution terminals 317 and first signal terminals 65.

In similar vein, a plurality of second redistribution terminals 427 may be provided on a lower surface of second interposer 420. Each second redistribution terminal 427 may be fabricated with a geometry and physically disposed at intervals that correspond to second signal terminals 67. A plurality of third redistribution terminals 428 is provided on the opposing upper surface of second interposer 420. The third redistribution terminals 428 provide electrical connection to the even memory device stack including second memory device 220'. That is each third redistribution terminal 428 is fabricated with a geometry and physically disposed at intervals that correspond to a second memory signal terminal 227' and electrically connected to a second redistribution terminal via an interposer interconnection 425. Accordingly, and as described above, through-connection to memory cells provided by fourth memory device 240' may be provided by elements 113', 227', 243' and 247'.

First redistribution terminals 317, redistribution vertical connection elements 327, second redistribution terminals 427, third redistribution terminal 428 and/or interposer interconnection 425 may be one formed from a material selected from a group consisting of Cu, Ti, Ta, TiN, TaN, Ni, W and combinations thereof.

Here again, first through fourth memory signal terminals 117, 227', 137 and 247' may be implemented using TSV structures. First through fourth memory signal terminals 117, 227', 137 and 247' may be formed from a material selected from a group consisting of Cu, Ti, Ta, TiN, TaN, Ni, W and combinations thereof. In one embodiment of the invention, first through fourth memory signal terminals 117, 227', 137 and 247' are implemented using a Ti/TiN layer.

First through fourth conductive bumps 113, 223', 133 and 243' may be implemented using a solder bump, a gold bump, a silver bump, a Ni bump, or combinations thereof. Alternately, first through fourth conductive bumps 113, 223', 133 and 243' may be replaced by a conductive ball, wiring, or a conductive spacer.

In one aspect of the embodiment illustrated in FIG. 5, the memory devices in the respective odd and even memory devices stacks (e.g., first memory device 110 and second memory device 220') may have different physical sizes or different I/O connection patterns. The use of one or more interposers in relation to such memory devices and a commonly connected logic device 60 allows accommodation for such differences. Yet, the odd and even memory device stacks may be operatively connected to logic device 60 is parallel to obtain higher relative operating speeds.

According to the foregoing embodiments of the invention, memory devices may be stacked connected both positively and negatively on opposing surfaces of a common logic device. Thus, data from the memory devices may be accessed in parallel using a single serializer/deserializer unit provided by the logic device. The resulting semiconductor package provides high-speed I/O characteristics at reduced costs.

Example embodiments of the present invention have been disclosed herein and, although specific terms are employed, they are used and are to be interpreted in a generic and descriptive sense only and not for purpose of limitation. For example, the memory devices 110, 220, 130, 240, 150 and 260 may be implemented as packaged (wholly or partially) semiconductor devices, semiconductor memory cores, or combinations thereof.

Accordingly, it will be understood by those of ordinary skill in the art that various changes in form and details may be made without departing from the scope of the invention as set forth in the following claims.

What is claimed is:

1. A semiconductor package, comprising:
   a base substrate;
   a logic device disposed on the base substrate, having an upper surface and an opposing lower surface facing the base substrate, and comprising a serializer/deserializer (SerDes); and
   a first semiconductor chip including multiple memory devices disposed on the lower surface of the logic device and operatively stack-connected with the SerDes,
   wherein the multiple memory devices are connected to circuitry disposed on the base substrate via the SerDes.

2. The package of claim 1, wherein the logic device further comprises:
   a substrate region comprising a plurality of vertical connection elements traversing the substrate region; and
   a circuit region provided on the substrate region, wherein the lower surface of the logic device contains the circuit region, and the circuit region comprises a plurality of first signal terminals.

3. The package of claim 2, wherein each one of the plurality of vertical connection elements is respectively connected to the SerDes via a corresponding one of a plurality of interconnections.

4. The package of claim 2, wherein each one of the plurality of first signal terminals elements is respectively connected to the SerDes via a corresponding one of a plurality of interconnections.

5. The package of claim 2, wherein the logic device further comprises a plurality of input and output (I/O) terminals electrically connected to the SerDes.

6. The package of claim 5, further comprising:
   a plurality of terminal interconnections electrically connecting each one of the I/O terminals.

7. The package of claim 1, further comprising:
   a second semiconductor chip including multiple memory devices disposed on the upper surface of the logic device and operatively stack-connected with the SerDes,
   wherein the first semiconductor chip and the second semiconductor chip are connected in parallel by the SerDes.

8. The package of claim 7, further comprising:
   a first interposer disposed between the logic device and the first semiconductor chip; and
   a second interposer disposed between the logic device and the second semiconductor chip.

9. The package of claim 8, wherein the first interposer comprises a plurality of first redistribution terminals, wherein each one of the plurality of first redistribution terminals is formed with a geometry and arranged at intervals to correspond to the plurality of first signal terminals.

10. The package of claim 9, wherein the first interposer further comprises a plurality of redistribution vertical connection elements, wherein each one of the plurality of redistribution vertical connection elements is formed with a geometry and arranged at intervals to correspond to a plurality of I/O terminals on the logic device.

11. The package of claim 10, wherein the second interposer comprises:
a plurality of second redistribution terminals; and
a plurality of third redistribution terminals, each one electrically connected to a corresponding one of the plurality of second redistribution terminals, wherein each one of the plurality of the second redistribution terminals is formed with a geometry and arranged at intervals to correspond to the plurality of vertical connection elements.

12. The package of claim 11, wherein the first semiconductor chip has a size different from the second semiconductor chip.

13. The package of claim 12, wherein the second semiconductor chip is smaller than the first semiconductor chip.

14. The package of claim 11, wherein the second semiconductor chip comprises a plurality of memory signal terminals formed with a geometry and arranged at intervals to correspond to the plurality of third redistribution terminals.

15. The package of claim 11, wherein the first semiconductor chip has a different connection pattern than the second semiconductor chip.

16. The package of claim 1, wherein the logic device is mechanically mounted on the base substrate.

17. The package of claim 16, wherein the lower surface of the logic device comprises a plurality of I/O terminals and the package further comprises a plurality of terminal interconnections each respectively extending from the base substrate to one of the plurality of I/O terminals.

18. The package of claim 17, wherein each one of the plurality of terminal interconnections respectively comprises at least one of a conductive ball, a conductive bump, a wire, and a spacer.

19. The package of claim 1, wherein the multiple memory devices of the first semiconductor chip are stack-connected as a functional group within the first semiconductor chip.

20. The package of claim 7, wherein the multiple memory devices of the second semiconductor chip are stack-connected as a functional group within the second semiconductor chip.

21. The package of claim 1, wherein the first semiconductor chip is disposed between the base substrate and the logic device.

* * * * *